(12) United States Patent
Zhu et al.

(10) Patent No.: US 7,244,644 B2
(45) Date of Patent: Jul. 17, 2007

(54) UNDERCUT AND RESIDUAL SPACER PREVENTION FOR DUAL STRESSED LAYERS

(75) Inventors: Huilong Zhu, Poughkeepsie, NY (US); Brian L. Tessier, Poughkeepsie, NY (US); Huicai Zhong, Wappingers Falls, NY (US); Ying Li, Newburgh, NY (US)

(73) Assignees: International Business Machines Corporation, Armonk, NY (US); Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 11/161,067

(22) Filed: Jul. 21, 2005

(65) Prior Publication Data

US 2007/0020838 A1    Jan. 25, 2007

(51) Int. Cl.
H01L 21/8238 (2006.01)

(52) U.S. Cl. ............ 438/199; 438/736; 438/738; 438/743; 438/744

(58) Field of Classification Search ............ 438/199, 438/723, 724, 736, 738, 743, 744, 788, 792
See application file for complete search history.

(56) References Cited

U.S. PATENT DOCUMENTS

| | | | | |
|---|---|---|---|---|
| 4,851,370 | A | 7/1989 | Doklan et al. | 438/762 |
| 5,506,169 | A | 4/1996 | Guldi | 438/449 |
| 5,538,916 | A | 7/1996 | Kuroi et al. | 438/445 |
| 5,580,815 | A | 12/1996 | Hsu et al. | 438/362 |
| 5,620,919 | A | 4/1997 | Godinho et al. | 438/230 |
| 5,633,202 | A | 5/1997 | Brigham et al. | 438/763 |
| 5,633,552 | A | 5/1997 | Lee et al. | 310/311 |
| 5,668,403 | A | 9/1997 | Kunikiyo | 257/639 |
| 5,707,889 | A | 1/1998 | Hsu et al. | 438/362 |
| 5,891,798 | A | 4/1999 | Doyle et al. | 438/624 |
| 5,908,312 | A | 6/1999 | Cheung et al. | 438/287 |
| 5,985,737 | A | 11/1999 | Wu | 438/448 |
| 6,040,619 | A | 3/2000 | Wang et al. | 257/649 |
| 6,046,494 | A | 4/2000 | Brigham et al. | 257/640 |
| 6,214,733 | B1 | 4/2001 | Sickmiller | 438/691 |
| 6,228,777 | B1 | 5/2001 | Arafa et al. | 438/740 |
| 6,306,742 | B1 | 10/2001 | Doyle et al. | 438/591 |
| 6,395,610 | B1 | 5/2002 | Roy et al. | 438/354 |
| 6,436,848 | B1 | 8/2002 | Ramkumar | 438/777 |
| 6,509,230 | B1 | 1/2003 | Roy et al. | 438/261 |
| 6,515,351 | B2 | 2/2003 | Arafa et al. | 257/644 |
| 6,573,172 | B1 * | 6/2003 | En et al. | 438/626 |
| 7,022,561 | B2 * | 4/2006 | Huang et al. | 438/197 |
| 2003/0040158 | A1 * | 2/2003 | Saitoh | 438/279 |
| 2003/0181005 | A1 * | 9/2003 | Hachimine et al. | 438/231 |
| 2004/0029323 | A1 * | 2/2004 | Shimizu et al. | 438/142 |
| 2005/0093030 | A1 | 5/2005 | Doris et al. | |
| 2005/0214998 | A1 * | 9/2005 | Chen et al. | 438/199 |
| 2006/0113641 | A1 * | 6/2006 | Hohage et al. | 257/640 |
| 2006/0128086 | A1 * | 6/2006 | Chidambarrao et al. | 438/199 |

* cited by examiner

*Primary Examiner*—Zandra V. Smith
*Assistant Examiner*—Toniae M. Thomas
(74) *Attorney, Agent, or Firm*—Todd M. C. Li; Hoffman, Warnick & D'Alessandro LLC

(57) ABSTRACT

Methods are disclosed for forming dual stressed layers in such a way that both undercutting and an undesirable residual spacer of the first-deposited stressed layer are prevented. In one embodiment, a method includes forming a first stressed silicon nitride layer over the NFET and the PFET, forming a sacrificial layer over the first stressed silicon nitride layer such that the sacrificial layer is thinner over substantially vertical surfaces than over substantially horizontal surfaces, forming a mask over a first one of the NFET and the PFET, removing the first stressed silicon nitride layer over a second one of the NFET and the PFET, and forming a second stressed silicon nitride layer over the second one of the NFET and the PFET. The sacrificial layer prevents undercutting and forming of an undesirable residual spacer during removal of the first-deposited stressed layer.

20 Claims, 10 Drawing Sheets

US 7,244,644 B2

UNDERCUT AND RESIDUAL SPACER PREVENTION FOR DUAL STRESSED LAYERS

BACKGROUND OF THE INVENTION

1. Technical Field

The present invention relates generally to semiconductor fabrication, and more particularly to preventing undercutting of a stressed layer during formation of a dual stressed layer for performance enhancement of semiconductor devices.

2. Related Art

The application of stresses to field effect transistors (FETs) is known to improve their performance. When applied in a longitudinal direction (i.e., in the direction of current flow), tensile stress is known to enhance electron mobility (or n-channel FET (NFET) drive currents) while compressive stress is known to enhance hole mobility (or p-channel FET (PFET) drive currents). One way to apply such stresses to a FET is the use of intrinsically-stressed barrier silicon nitride layers. For example, a tensile-stressed silicon nitride layer may be used to cause tension in an NFET channel while a compressively-stressed silicon nitride layer may be used to cause compression in a PFET channel. Accordingly, a dual stressed barrier layer is necessary to induce the desired stresses in an adjacent NFET and PFET.

In the formation of a dual barrier silicon nitride layers for stress enhancement of NFET/PFET devices, the first deposited layer is deposited and then is removed over the appropriate FET region by patterning and etching. The second layer is then deposited and then removed over the other of the two FET regions by patterning and etching. One challenge relative to this process is undercutting of the first-deposited stressed layer due to isotropical etch of the first-deposited stressed layer. In particular, the undercut is difficult to refill when the second-deposited stressed layer is deposited. As a result, voids are often formed, which can cause shorting in devices during metal contact formation, thus reducing yield of chips per wafer. One way to address this situation is to use an anisotropical etch to etch the first-deposited stressed layer without undercut. However, undesirable additional spacers remain in the areas (e.g., on the spacer side wall of the FET having the second-deposited stressed layer) where the second layer is deposited, which can degrade device performance of the FET having the second-deposited stressed layer. This situation can also cause gap filling among devices and make it difficult to etch via contacts.

In view of the foregoing, there is a need in the art for a solution to prevent undercutting during formation of dual stressed layers.

SUMMARY OF THE INVENTION

Methods are disclosed for forming dual stressed layers in such a way that both undercutting and an undesirable residual spacer of the first-deposited stressed layer are prevented. In one embodiment, a method includes forming a first stressed silicon nitride layer over the NFET and the PFET, forming a sacrificial layer over the first stressed silicon nitride layer such that the sacrificial layer is thinner over substantially vertical surfaces than over substantially horizontal surfaces, forming a mask over a first one of the NFET and the PFET, removing the first stressed silicon nitride layer over a second one of the NFET and the PFET, and forming a second stressed silicon nitride layer over the second one of the NFET and the PFET. The sacrificial layer prevents undercutting and undesirable residual spacers during removal of the first-deposited stressed layer.

A first aspect of the invention is directed to a method for forming a dual stressed layer for a semiconductor device having an NFET and a PFET, the method comprising the steps of: forming a first stressed silicon nitride layer over the NFET and the PFET; forming a sacrificial layer over the first stressed silicon nitride layer such that the sacrificial layer is thinner over substantially vertical surfaces than over substantially horizontal surfaces; forming a mask over a first one of the NFET and the PFET; removing the first stressed silicon nitride layer over a second one of the NFET and the PFET; removing the mask; and forming a second stressed silicon nitride layer over the second one of the NFET and the PFET.

A second aspect of the invention includes a method for forming a dual stressed layer for a semiconductor device having an NFET and a PFET, the method comprising the steps of: forming a first stressed layer over the NFET and the PFET; forming a sacrificial layer over the first stressed layer; forming a mask over a first one of the NFET and the PFET such that a second one of the NFET and the PFET is exposed; removing the first stressed layer over the second one of the NFET and the PFET, using the sacrificial layer to prevent undercutting of the first stressed layer and an undesirable residual spacer, by: first removing the sacrificial layer to expose substantially vertical surfaces of the first stressed layer over the second one of the NFET and the PFET; second removing the substantially vertical surfaces of the first stressed layer over the second one of the NFET and the PFET; third removing the sacrificial layer from the substantially horizontal surfaces of the first stressed layer over the second one of the NFET and the PFET; and fourth removing the substantially horizontal surfaces of the first stressed layer over the second one of the NFET and the PFET; removing the mask; and forming a second stressed layer over the second one of the NFET and the PFET.

A third aspect of the invention is related to a method for forming a dual stressed layer for a semiconductor device having an NFET and a PFET, the method comprising the steps of: forming a first stressed layer over the NFET and the PFET; forming a sacrificial layer over the first stressed layer such that the sacrificial layer is thinner over substantially vertical surfaces than over substantially horizontal surfaces; forming a mask over a first one of the NFET and the PFET such that a second one of the NFET and the PFET is exposed; removing the first stressed layer over the second one of the NFET and the PFET by: first removing the sacrificial layer to expose substantially vertical surfaces of the first stressed layer over the second one of the NFET and the PFET; second removing the substantially vertical surfaces of the first stressed layer over the second one of the NFET and the PFET; third removing the sacrificial layer from the substantially horizontal surfaces of the first stressed layer over the second one of the NFET and the PFET; and simultaneously removing the mask and the substantially horizontal surfaces of the first stressed layer over the second one of the NFET and the PFET; and forming a second stressed layer over the second one of the NFET and the PFET.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION

With reference to the accompanying drawings, FIGS. 1–10 show steps of a method for forming dual stressed layers for a semiconductor device having an NFET and a PFET without undercutting the first-deposited stressed layer and without creating an undesirable residual spacer according to various embodiments of the invention. In the following description, each stressed layer will be described as a silicon nitride ($Si_3N_4$) layer. However, it should be recognized that the teachings of the invention may be employed with any now known or later developed materials for applying a stress in a semiconductor device.

Figure 1:
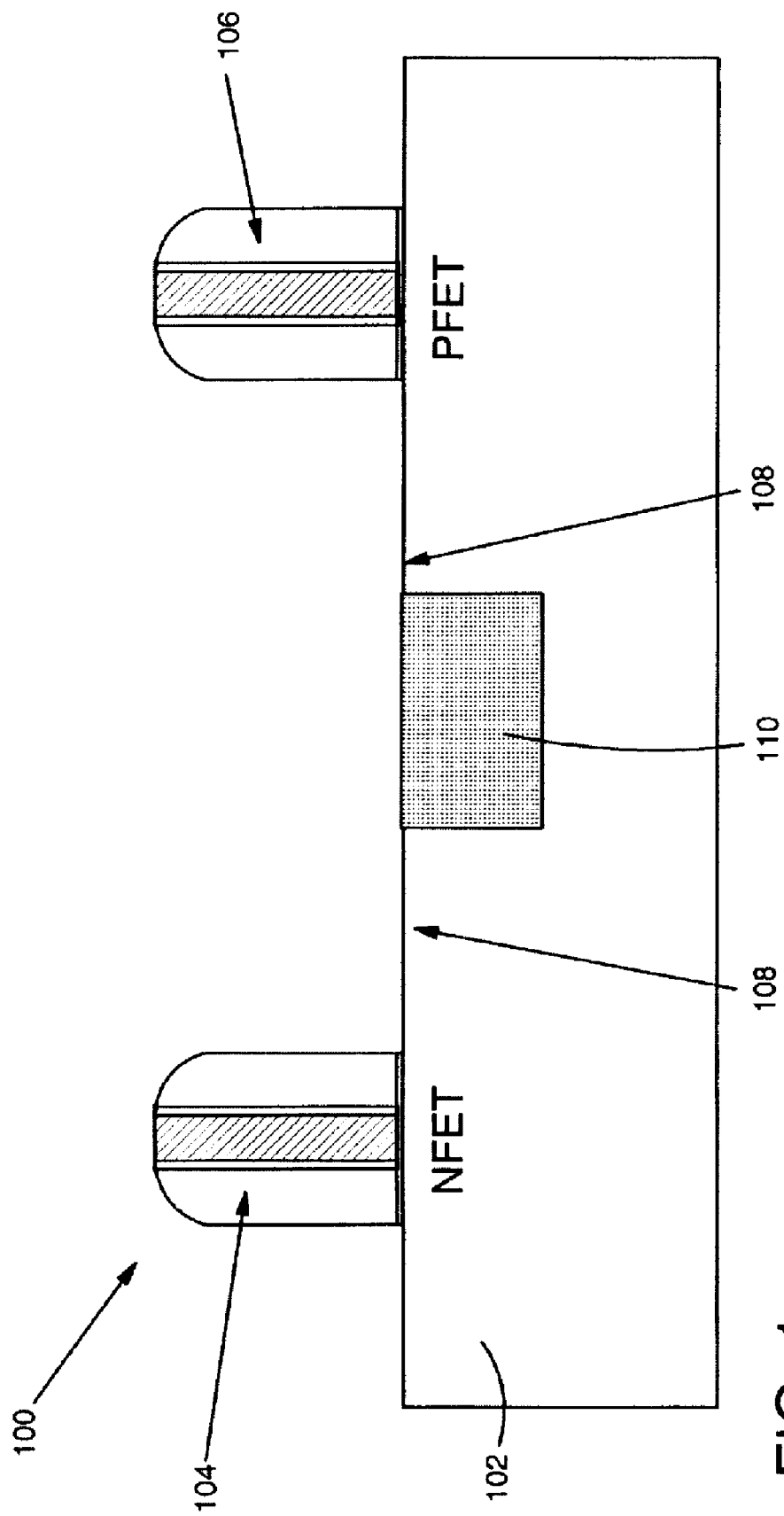
FIGS. 1–10 show steps of a method for forming dual stressed layers without undercutting according to various embodiments of the invention.

Referring to FIG. 1, processing begins with a pre-formed structure 100 including a silicon substrate 102 including an n-type field effect transistor (NFET) 104 (including silicide in the source/drain region (not shown) and top part of gate) and a p-type field effect transistor (PFET) 106 (including silicide in the source/drain region (not shown) and top part of gate) formed thereon. NFET 104 and PFET 106 may be separated by an intermediate region 108, which may include a trench isolation 110, e.g., a shallow trench isolation (STI). Each FET includes conventional structures such as a gate oxide, oxide liner, a polysilicon gate, silicon nitride spacer and appropriate dopant(s).

Figure 2:
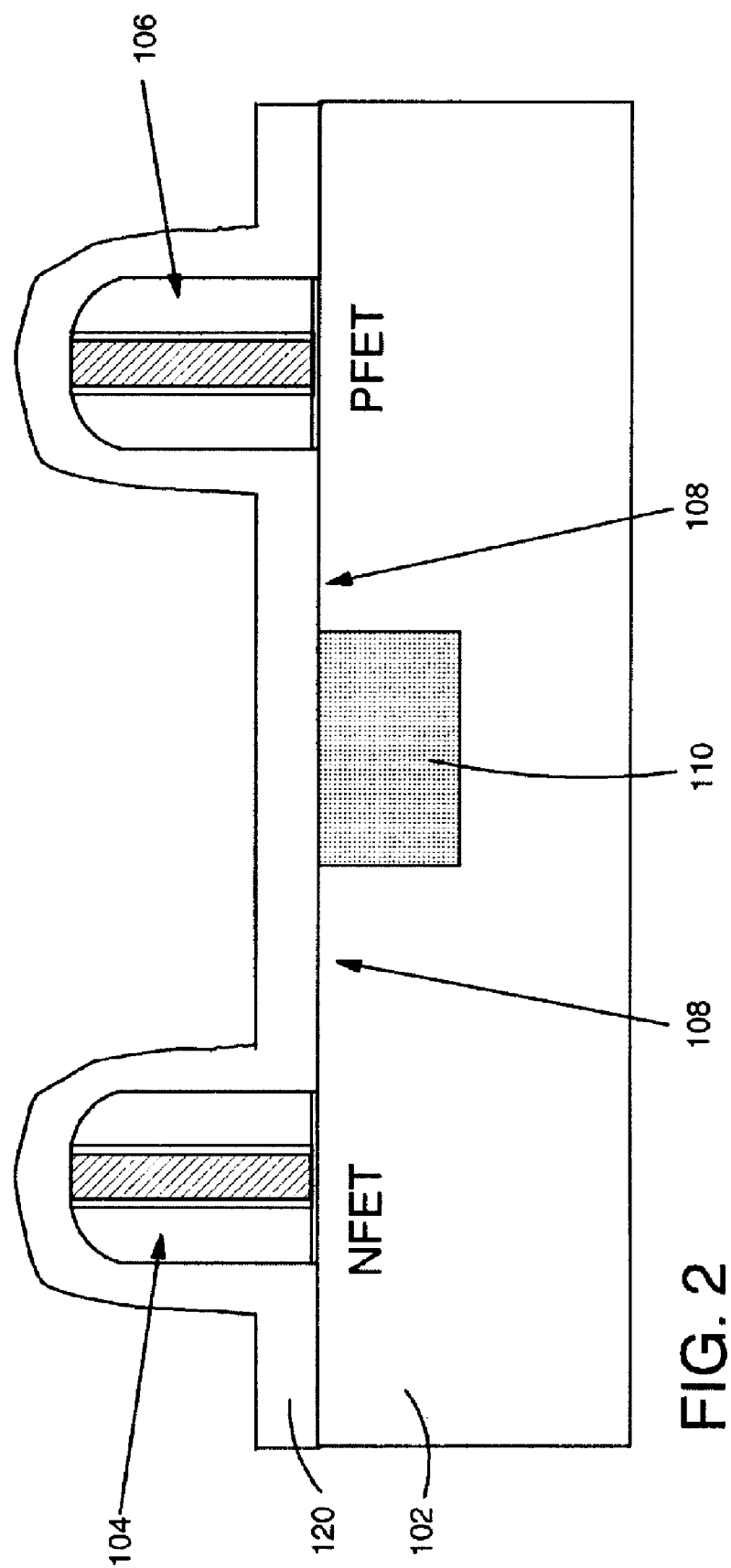

FIG. 2 shows a step of forming a first stressed silicon nitride layer 120 (hereinafter "first stressed layer 120") over a first one of NFET 104 and PFET 106, i.e., ultimately not both the NFET and the PFET. In one embodiment, the 'first one' includes NFET 104 and a 'second one' includes PFET 106. Accordingly, first stressed layer 120 includes a tensile silicon nitride, which enhances performance of NFET 104, and a second stressed silicon nitride layer, to be described below, includes a compressive silicon nitride, which enhances PFET 106. It should be recognized, however, that the order in which the stressed layers are formed can be reversed. That is, a compressive silicon nitride layer may be formed first over PFET 106.

As shown in FIG. 2, a first step includes forming (e.g., depositing) first stressed layer 120 over NFET 104 and PFET 106. Deposition can be by any now known or later developed technique such as chemical vapor deposition (CVD). First stressed layer 120 may have a thickness of, for example, approximately 50 nm to approximately 100 nm.

Figure 3:
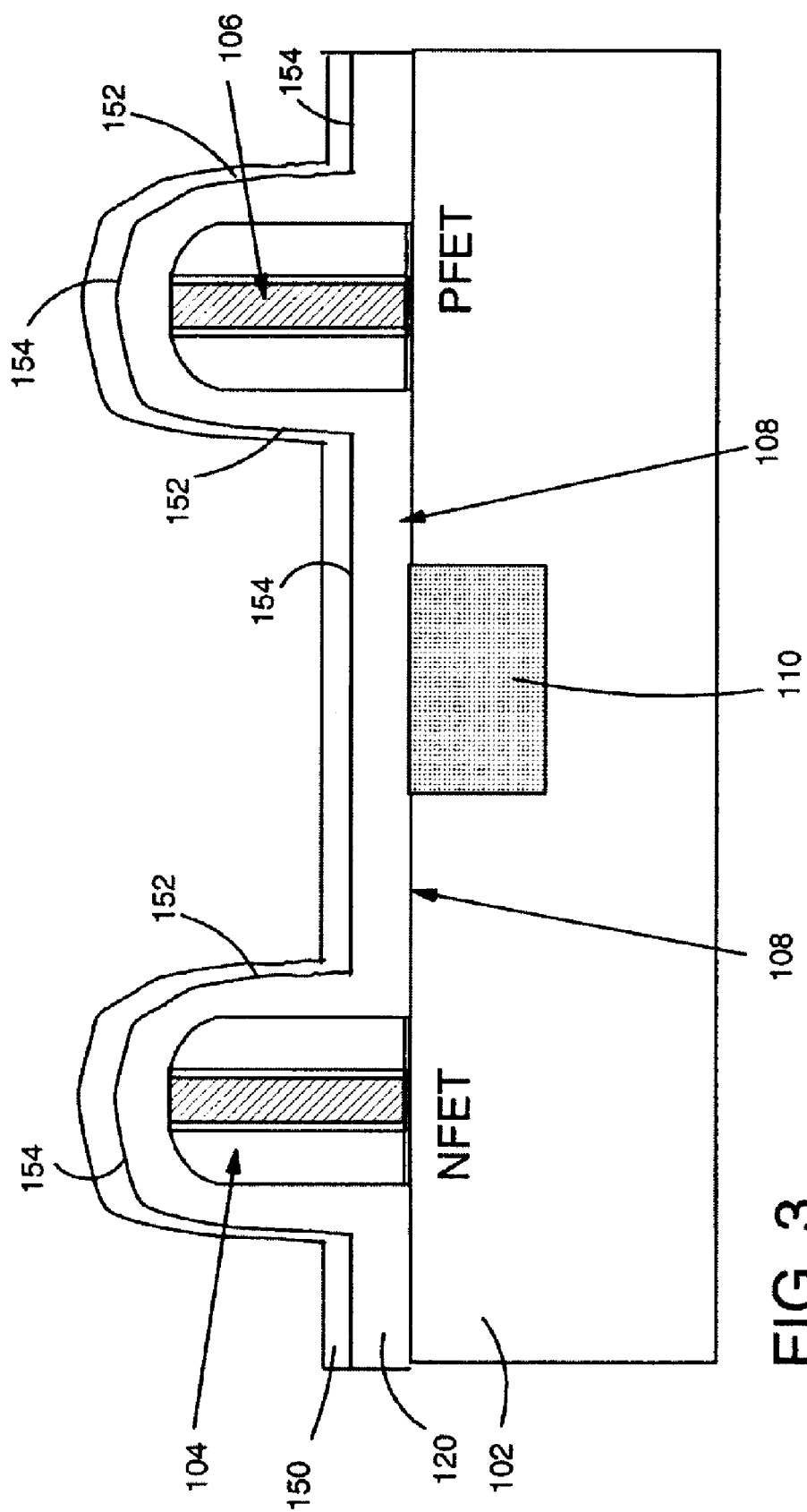

FIG. 3 shows a next step of forming a sacrificial layer 150 over first stressed layer 120. In one preferred embodiment, sacrificial layer 150 is formed such that it is thinner over substantially vertical surfaces 152 than over substantially horizontal surfaces 154. Sacrificial layer 150 may have a thickness of, for example, approximately 10 nm to approximately 30 nm at thicker sections and approximately 3 nm to approximately 7 nm at thinner sections, i.e., approximately 3 nm to approximately 30 nm. In one embodiment, sacrificial layer 150 includes silicon dioxide ($SiO_2$) or silicon nitride ($Si_3N_4$). One illustrative manner of forming sacrificial layer 150 with this structure is to deposit it using a high density plasma (HDP). Other deposition techniques may also be used, e.g., plasma enhanced chemical vapor deposition (PECVD).

Figure 4:
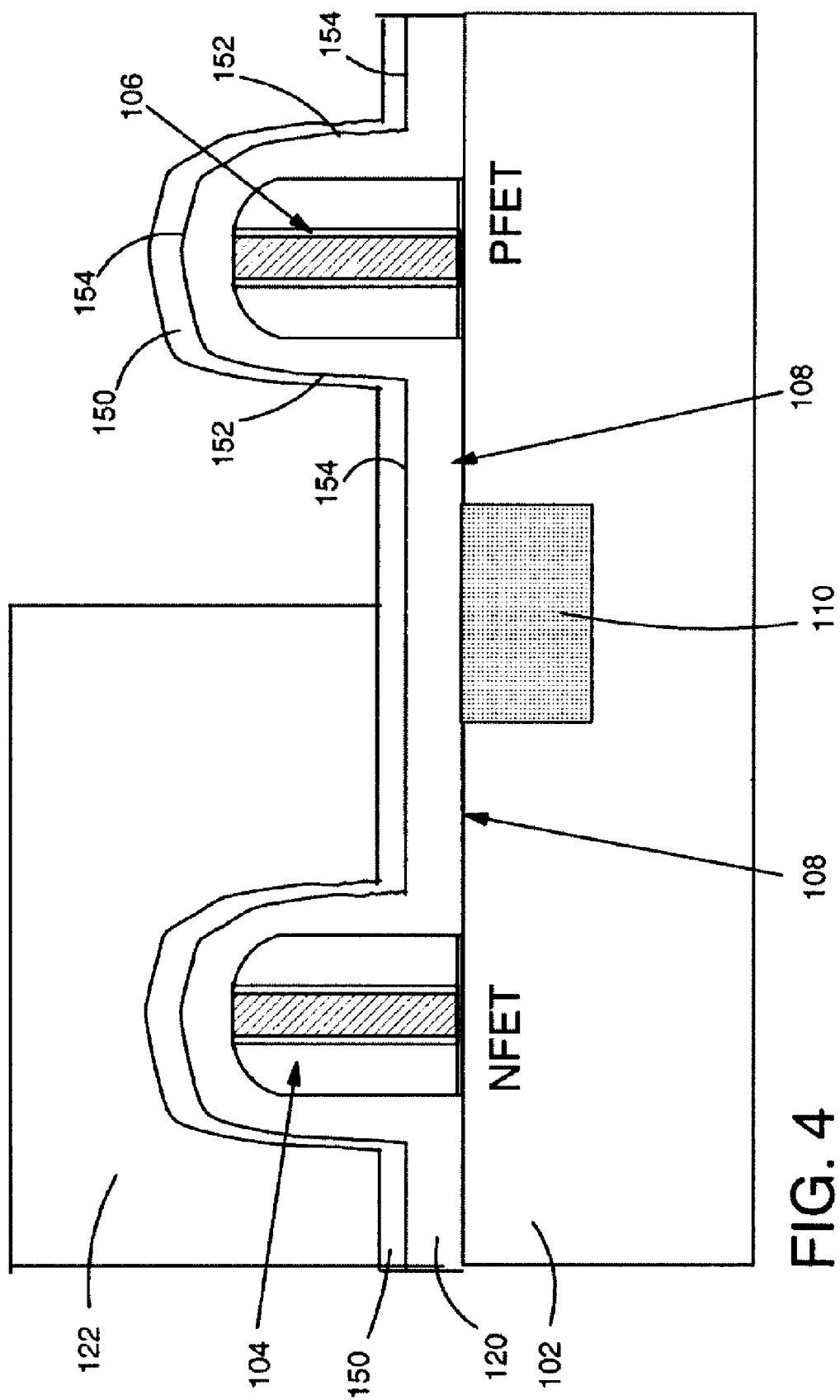

FIG. 4 shows a step of forming a mask 122, i.e., photoresist, over a first one of NFET 104 and PFET 106, i.e., such that a second one of NFET 104 and PFET 106 is exposed. In the illustrated embodiment, PFET 106 is exposed. Mask 122 can be formed in any now known or later developed fashion, and may include any conventional mask material.

Figure 5:
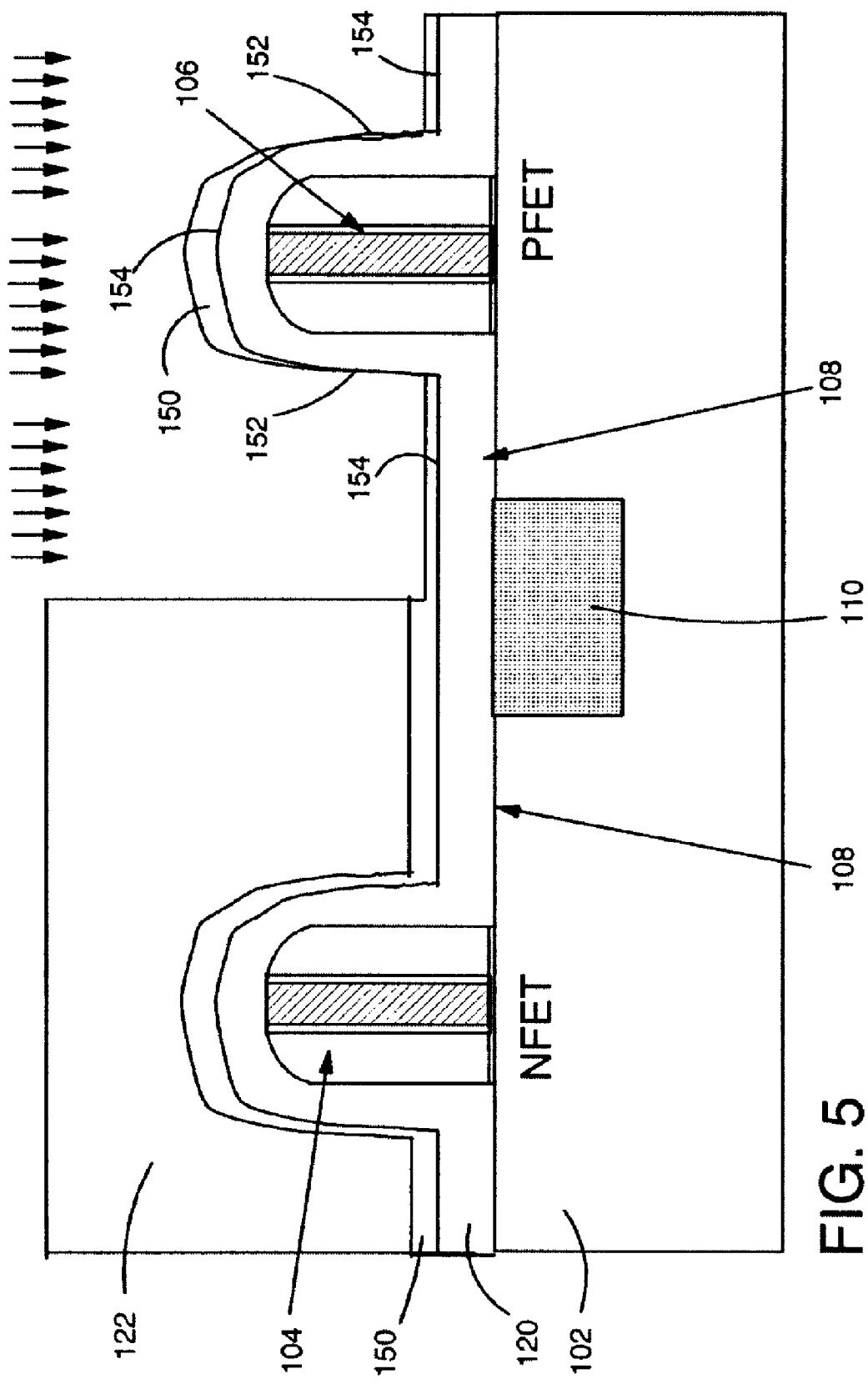
Figure 6:
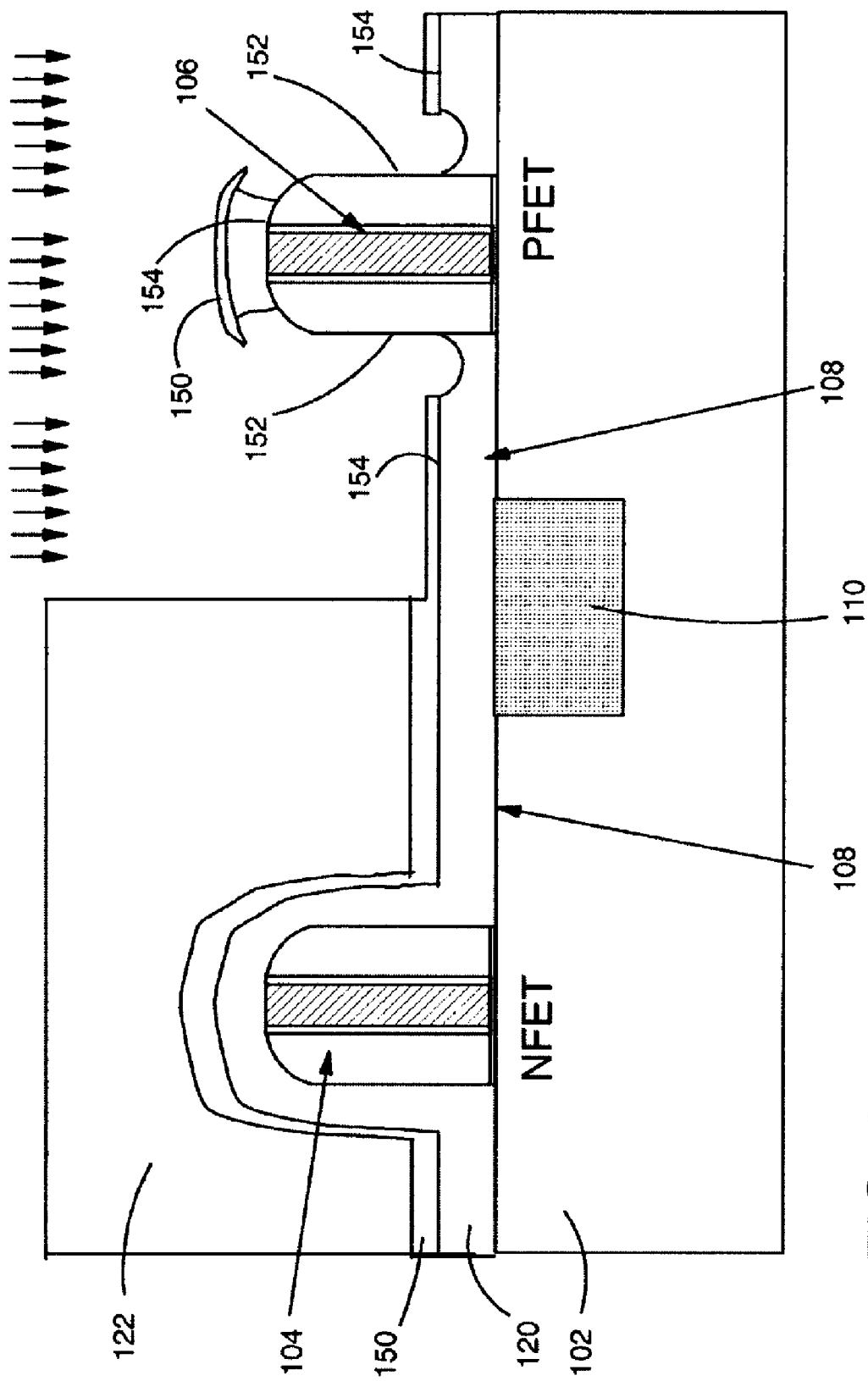
Figure 7:
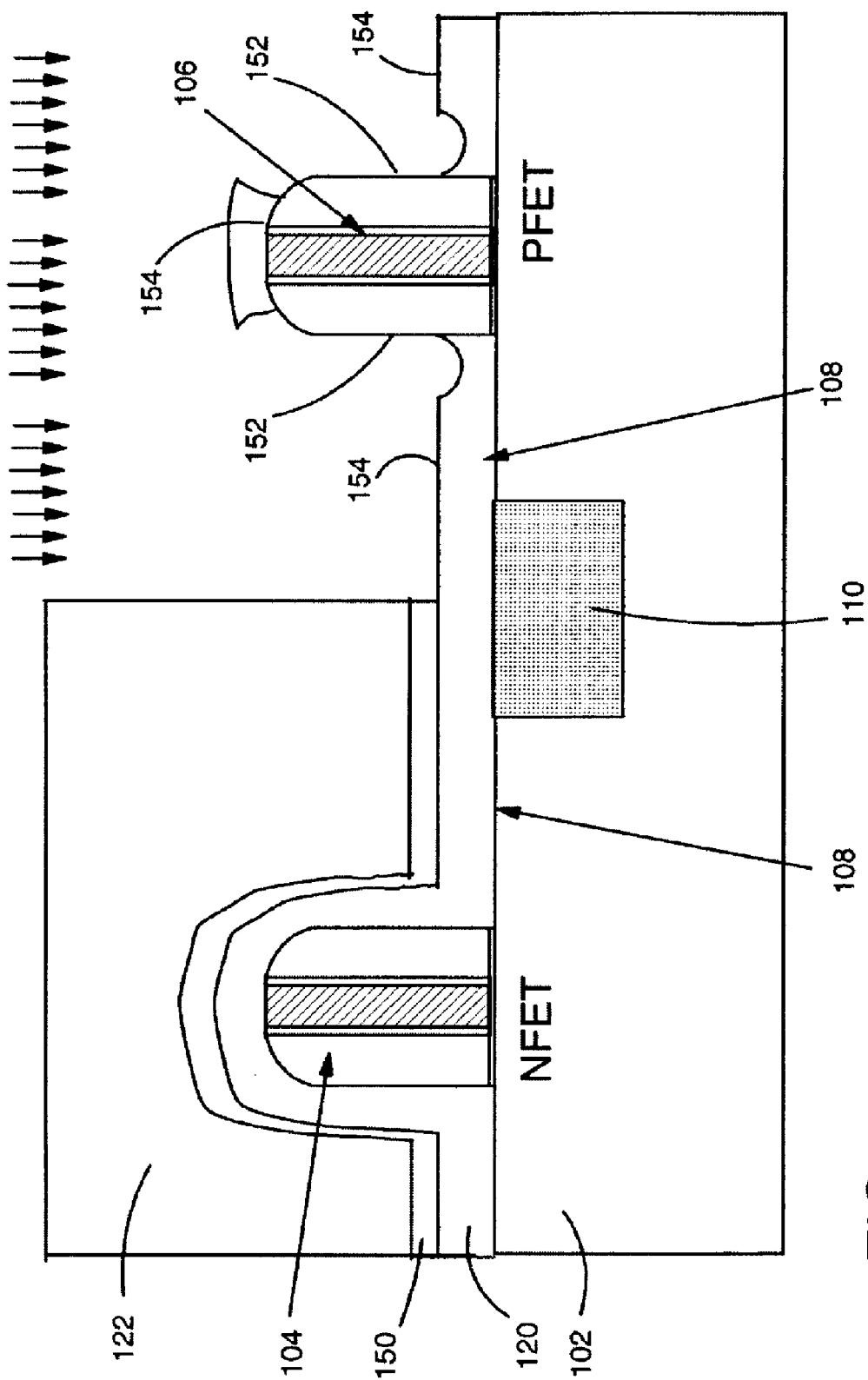
Figure 8:
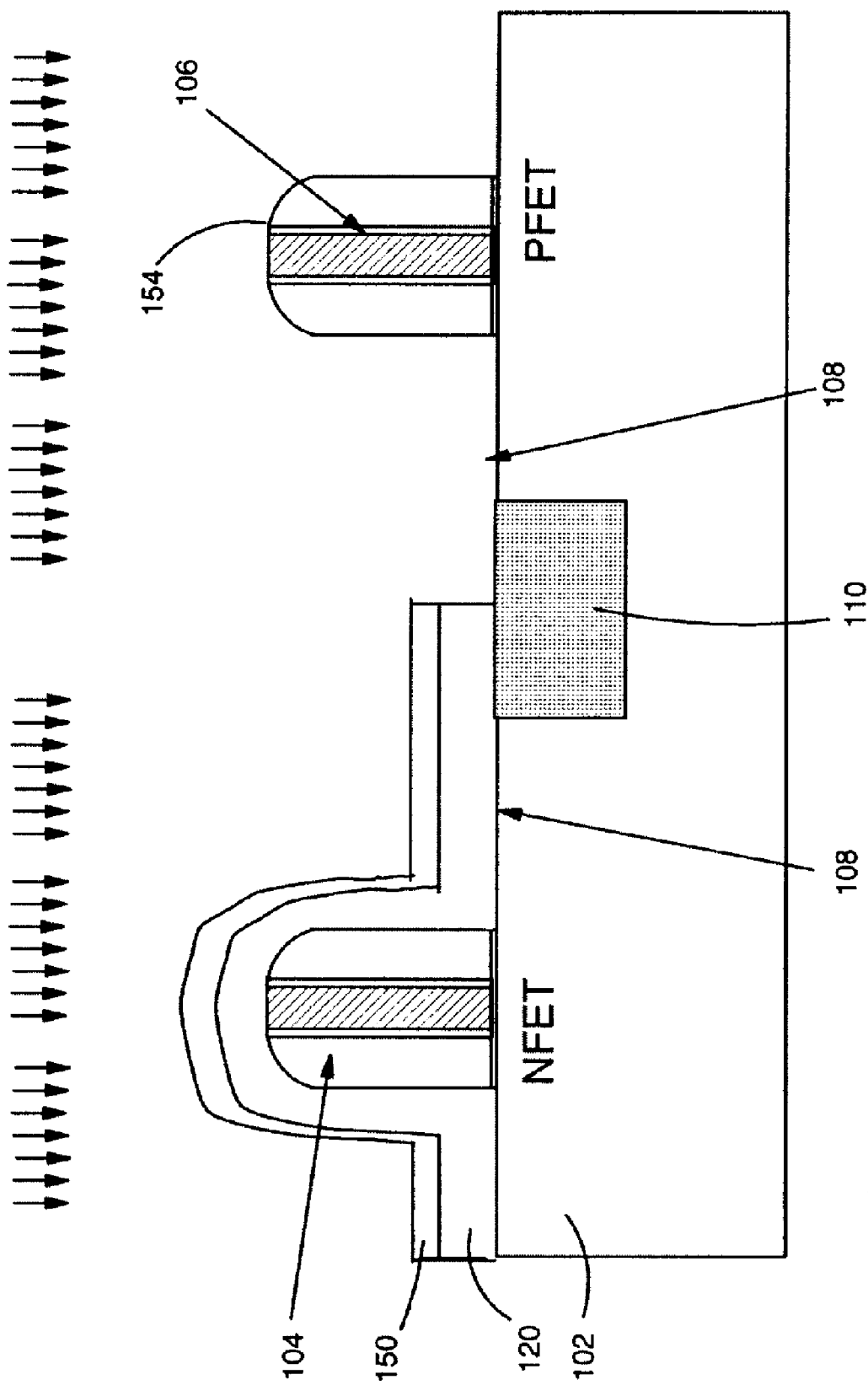

FIGS. 5–8 show a step of removing first stressed layer 120 over a second one of NFET 104 and PFET 106, i.e., PFET 106 as shown. Typically, this step would include sacrificial layer 150 being at least partially removed under mask 122 such that an undercut would exist. As will be described below, however, sacrificial layer 150 prevents undercutting of first stressed layer 120 during the removing step. In one embodiment, sacrificial layer 150 removing step includes a number of sub-steps. FIG. 5 shows a sub-step including (first) removing sacrificial layer 150 to expose substantially vertical surfaces 152 of first stressed layer 120 over the second one of NFET 104 and PFET 106, i.e., PFET 106 as shown. In one embodiment, this sub-step includes performing an isotropic etch. Note that sacrificial layer 150 still covers first stressed layer 120 on substantially horizontal surfaces 154 thereof after this step because of the greater thickness of sacrificial layer 150 at those locations. FIG. 6 shows another (second) sub-step including removing substantially vertical surfaces 152 of first stressed layer 120 over the second one of NFET 104 and PFET 106, i.e., PFET 106 as shown. In one embodiment, this sub-step includes performing an isotropic etch. This step etches a portion of first stressed layer 120 on the spacer of the second of NFET and PFET, i.e., PFET 106 as shown. FIG. 7 shows another (third) sub-step including removing sacrificial layer 150 from substantially horizontal surfaces 154 of first stressed layer 120 over the second one of NFET 104 and PFET 106, i.e., PFET 106 as shown. In one embodiment, this sub-step includes performing an anisotropical etch such as a reactive ion etch (RIE), suitable for sacrificial layer 150. FIG. 8 shows another (fourth) sub-step including removing substantially horizontal surfaces 154 of first stressed layer 120 over the second one of NFET 104 and PFET 106, i.e., PFET 106 as shown. In one embodiment, this sub-step includes performing an anisotropical etch such as a reactive ion etch (RIE) suitable for first stressed layer 120. In addition, in one preferred embodiment, this sub-step also includes simultaneously removing mask 122 (FIG. 7). That is, the RIE is suitable for first stressed layer 120 and mask 122, or two RIE steps are performed sequentially.

Figure 9:
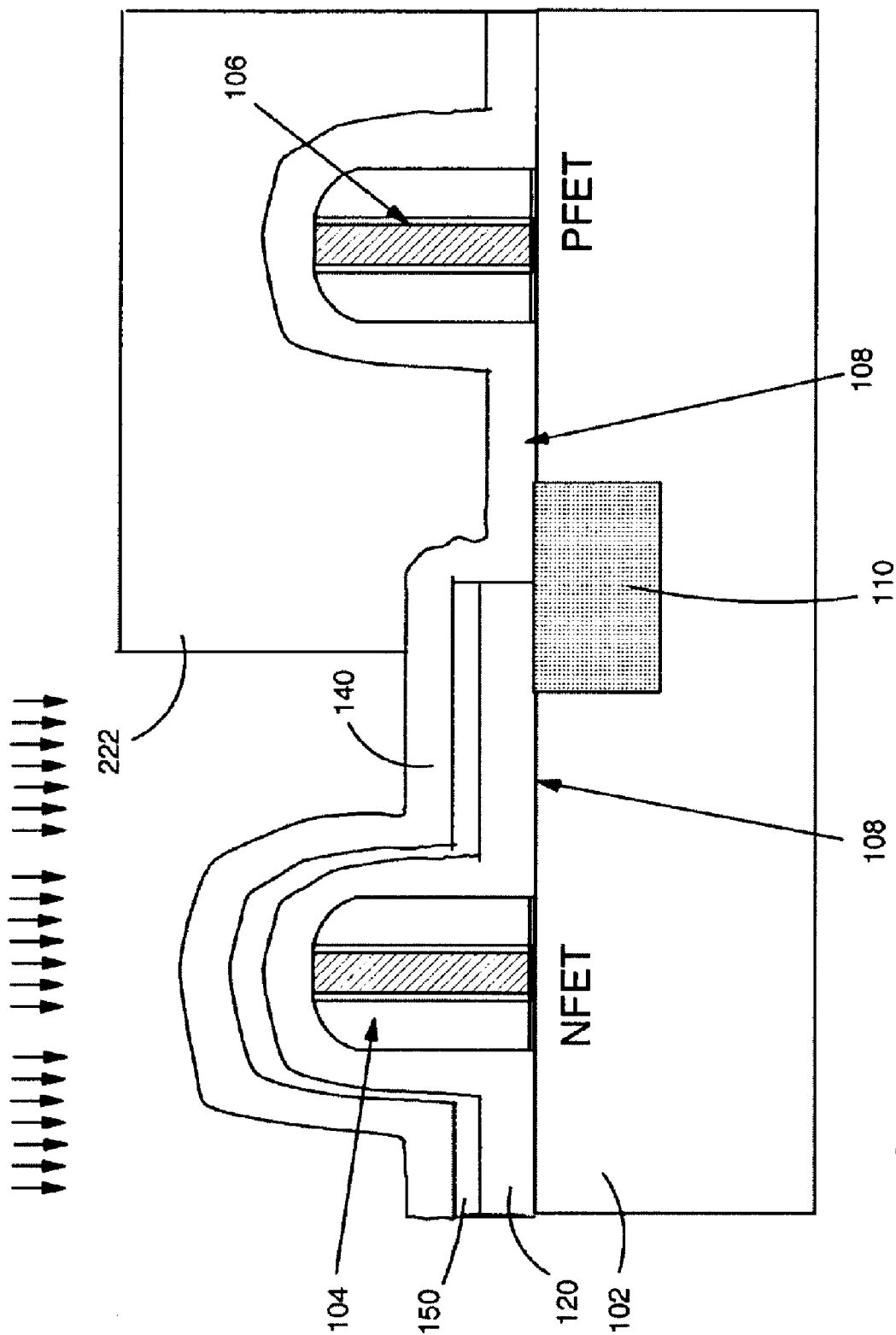
Figure 10:
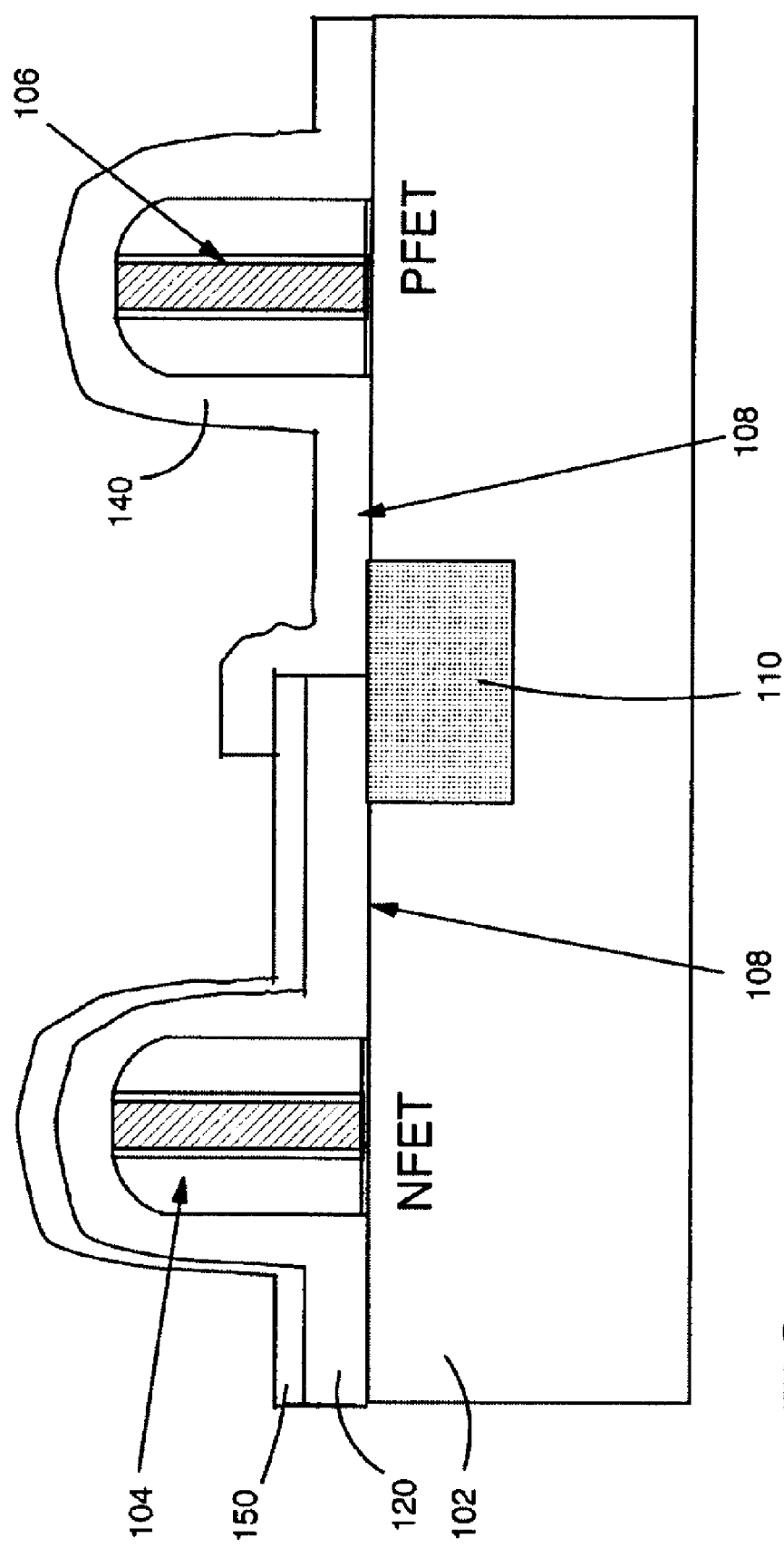

At this stage, the second one of NFET 104 and PFET 106, i.e., PFET 106 as shown, is cleared for forming a second stressed silicon nitride layer 140 (FIGS. 9–10)(hereinafter "second stressed layer") over the second one of NFET 104 and PFET 106, i.e., PFET 106. FIGS. 9–10 show the step of forming second stressed layer 140 over PFET 106. As shown in FIG. 9, this step may include depositing second stressed layer 140 over NFET 104 and PFET 106. Deposition can be by any now known or later developed technique such as chemical vapor deposition (CVD). FIG. 9 also shows the step of removing second stressed layer 140 over the first one of NFET 104 and PFET 106, i.e., NFET 104 as shown. This step may include forming a mask 222 and etching second stressed layer 140 from over the first one of NFET 104 and PFET 106.

The resulting semiconductor device FIG. 10, shown partially in FIG. 10, includes NFET 104 and PFET 106 and appropriate performance enhancing dual stressed layers 120, 140, i.e., a tensile stressed layer 120 over NFET 104 and a compressive stressed layer 140 over PFET 106. The semiconductor device, however, does not include an undercut of the first-deposited stressed layer and no residual spacer from the first stressed layer is created, thus removing the possibility of shorts, and improving both yield and performance of a complementary metal-oxide semiconductor (CMOS) device.

In the above description and attached claims, certain removing steps have been described as, for example, first, second, third and fourth. Those numerical designations are presented for differentiation purposes only. The steps may occur in an order different than that described. Furthermore, although particular etching techniques have been identified for each removing step, it should be recognized that each removal step may include any now known or later developed etching technique for the particular material being removed.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method for forming a dual stressed layer for a semiconductor device having an NFET and a PFET, the method comprising the steps of:
    forming a first stressed silicon nitride layer over the NFET and the PFET;
    forming a sacrificial layer over the first stressed silicon nitride layer such that the sacrificial layer is thinner over an entire length of all substantially vertical surfaces than over substantially horizontal surfaces;
    forming a mask over a first one of the NFET and the PFET;
    removing the first stressed silicon nitride layer over a second one of the NFET and the PFET;
    removing the mask; and
    forming a second stressed silicon nitride layer over the second one of the NFET and the PFET.

2. The method of claim 1, wherein the first stressed silicon nitride layer removing step includes:
    first removing the sacrificial layer to expose substantially vertical surfaces of the first stressed silicon nitride layer over the second one of the NFET and the PFET;
    second removing the substantially vertical surfaces of the first stressed silicon nitride layer over the second one of the NFET and the PFET;
    third removing the sacrificial layer from the substantially horizontal surfaces of the first stressed silicon nitride layer over the second one of the NFET and the PFET; and
    fourth removing the substantially horizontal surfaces of the first stressed silicon nitride layer over the second one of the NFET and the PFET.

3. The method of claim 2, wherein the fourth removing step occurs simultaneously with the mask removing step.

4. The method of claim 2, wherein the first and second removing steps include an isotropic etch, and wherein the sacrificial layer includes one of silicon dioxide ($SiO_2$) and silicon nitride ($Si_3N_4$) and the third and fourth removing steps include an anistropic etch.

5. The method of claim 1, wherein the sacrificial layer forming step includes depositing using a high density plasma.

6. The method of claim 1, wherein the second stressed silicon nitride layer forming step includes:
    depositing the second stressed silicon nitride layer over the NFET and the PFET; and
    removing the second stressed silicon nitride layer over the first one of the NFET and the PFET.

7. The method of claim 1, wherein the sacrificial layer has a thickness of no less than approximately 3 nm and no greater than approximately 30 nm.

8. The method of claim 1, wherein the first one is the NFET and the first stressed silicon nitride layer is a tensile silicon nitride, and the second one is the PFET and the second stressed silicon nitride layer is a compressive silicon nitride.

9. The method of claim 1, wherein the sacrificial layer includes one of silicon dioxide ($SiO_2$) and silicon nitride ($Si_3N_4$).

10. A method for forming a dual stressed layer for a semiconductor device having an NFET and a PFET, the method comprising the steps of:
    forming a first stressed layer over the NFET and the PFET;
    forming a sacrificial layer over the first stressed layer;
    forming a mask over a first one of the NFET and the PFET such that a second one of the NFET and the PFET is exposed;
    removing the first stressed layer over the second one of the NFET and the PFET, using the sacrificial layer to prevent undercutting of the first stressed layer and an undesirable residual spacer, by:
        first removing the sacrificial layer to expose substantially vertical surfaces of the first stressed layer over the second one of the NFET and the PFET;
        second removing the substantially vertical surfaces of the first stressed layer over the second one of the NFET and the PFET;
        third removing the sacrificial layer from the substantially horizontal surfaces of the first stressed layer over the second one of the NFET and the PFET; and
        fourth removing the substantially horizontal surfaces of the first stressed layer over the second one of the NFET and the PFET;
    removing the mask; and
    forming a second stressed layer over the second one of the NFET and the PFET.

11. The method of claim 10, wherein the sacrificial layer includes one of silicon dioxide ($SiO_2$) and silicon nitride ($Si_3N_4$), and the third and fourth removing steps include an anisotropic etch.

12. The method of claim 10, wherein the fourth removing step occurs simultaneously with the mask removing step.

13. The method of claim 10, wherein the first and second removing steps include an isotropic etch.

14. The method of claim 10, wherein the sacrificial layer forming steps includes forming the sacrificial layer over the first stressed silicon nitride layer such that the sacrificial layer is thinner over substantially vertical surfaces than over substantially horizontal surfaces.

15. The method of claim 10, wherein the second stressed silicon nitride layer forming step includes: depositing the second stressed silicon nitride layer over the NFET and the PFET; and removing the second stressed silicon nitride layer over the first one of the NFET and the PFET.

16. The method of claim 10, wherein the sacrificial layer has a thickness of no less than approximately 3 nm and no greater than approximately 30 nm.

17. The method of claim 10, wherein the first one is the NFET and the first stressed silicon nitride layer is a tensile silicon nitride, and the second one is the PFET and the second stressed silicon nitride layer is a compressive silicon nitride.

18. A method for forming a dual stressed layer for a semiconductor device having an NFET and a PFET, the method comprising the steps of:

forming a first stressed layer over the NFET and the PFET;

forming a sacrificial layer over the first stressed layer such that the sacrificial layer is thinner over substantially vertical surfaces than over substantially horizontal surfaces;

forming a mask over a first one of the NFET and the PFET such that a second one of the NFET and the PFET is exposed;

removing the first stressed layer over the second one of the NFET and the PFET by:

first removing the sacrificial layer to expose substantially vertical surfaces of the first stressed layer over the second one of the NFET and the PFET;

second removing the substantially vertical surfaces of the first stressed layer over the second one of the NFET and the PFET;

third removing the sacrificial layer from the substantially horizontal surfaces of the first stressed layer over the second one of the NFET and the PFET; and simultaneously removing the mask and the substantially horizontal surfaces of the first stressed layer over the second one of the NFET and the PFET; and forming a second stressed layer over the second one of the NFET and the PFET.

19. The method of claim 18, wherein the first one is the NFET and the first stressed silicon nitride layer is a tensile silicon nitride, and the second one is the PFET and the second stressed silicon nitride layer is a compressive silicon nitride.

20. The method of claim 18, wherein the sacrificial layer includes one of silicon dioxide ($SiO_2$) and silicon nitride ($Si_3N_4$).

* * * * *